United States Patent
Shimosato et al.

(10) Patent No.: US 11,845,275 B2
(45) Date of Patent: Dec. 19, 2023

(54) LIQUID DISCHARGE HEAD

(71) Applicant: TOSHIBA TEC KABUSHIKI KAISHA, Tokyo (JP)

(72) Inventors: Masashi Shimosato, Mishima Shizuoka (JP); Taiki Goto, Izunokuni Shizuoka (JP); Akio Hamada, Mishima Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 25 days.

(21) Appl. No.: 17/537,940

(22) Filed: Nov. 30, 2021

(65) Prior Publication Data

US 2022/0305786 A1 Sep. 29, 2022

(30) Foreign Application Priority Data

Mar. 25, 2021 (JP) ................ 2021-051490

(51) Int. Cl.
*B41J 2/14* (2006.01)
*H10N 30/50* (2023.01)
(Continued)

(52) U.S. Cl.
CPC ........ *B41J 2/14201* (2013.01); *H10N 30/057* (2023.02); *H10N 30/063* (2023.02); *H10N 30/088* (2023.02); *H10N 30/2047* (2023.02); *H10N 30/50* (2023.02); *H10N 30/8542* (2023.02); *H10N 30/8554* (2023.02); *H10N 30/871* (2023.02); *H10N 30/872* (2023.02); *H10N 30/875* (2023.02)

(58) Field of Classification Search
None
See application file for complete search history.

(56) References Cited

U.S. PATENT DOCUMENTS 6,338,549 B1 1/2002 Kitahara et al.
7,926,919 B2 4/2011 Kakuda
(Continued)

FOREIGN PATENT DOCUMENTS

EP 0931651 A1 7/1999
JP 2011056730 A 3/2011
(Continued)

OTHER PUBLICATIONS

Extended European Search Report dated Jul. 6, 2022, mailed in counterpart European Application No. 22152644.5, 8 pages.

*Primary Examiner* — Erica S Lin
(74) *Attorney, Agent, or Firm* — Kim & Stewart LLP

(57) ABSTRACT

According to one embodiment, a liquid discharge head includes a flexible printed circuit (FPC) connected to piezoelectric elements. The FPC has a first end in the first direction. A wiring layer of the FPC has a first region at the first end and a cover layer covering on a second region. The piezoelectric elements are spaced from each other in a second direction and each has a first electrode on a side surface facing towards the FPC. The first side has a joint surface facing the first region of the wiring layer. The first electrode is electrically connected to the wiring layer at the joint surface. The side surface includes a step portion that is recessed from the joint surface. A portion of the cover layer protrudes into a space adjacent to the step portion.

20 Claims, 8 Drawing Sheets

(51) Int. Cl.
*H10N 30/057* (2023.01)
*H10N 30/063* (2023.01)
*H10N 30/088* (2023.01)
*H10N 30/87* (2023.01)
*H10N 30/20* (2023.01)
*H10N 30/853* (2023.01)

(56) References Cited

U.S. PATENT DOCUMENTS

2004/0218019 A1    11/2004  Takahashi
2015/0325777 A1*   11/2015  Irie ........................ B23K 31/02
                                                              347/50
2020/0243745 A1*    7/2020  Ishizaki ................. H10N 30/50

FOREIGN PATENT DOCUMENTS

JP    2012232457 A   11/2012
JP       5381186 B2   1/2014

* cited by examiner

LIQUID DISCHARGE HEAD

CROSS-REFERENCE TO RELATED APPLICATION

This application is based upon and claims the benefit of priority from Japanese Patent Application No. 2021-051490, filed Mar. 25, 2021, the entire contents of which are incorporated herein by reference.

FIELD

Embodiments described herein relate generally to a liquid discharge head.

BACKGROUND

A piezoelectric actuator using a piezoelectric material such as lead zirconate titanate (PZT) can be used for driving a liquid discharge device such as an inkjet printer head. In an inkjet printer head, actuators are arranged at very small intervals and the wiring connecting to drive the actuators is also necessarily fine. A flexible wiring or printed circuit board (FPC) may be directly soldered to an electrode of a piezoelectric actuator in order to support wiring having a fine pitch of about 100 µm. In such a piezoelectric actuator, the electrodes to which the FPC is attached are used as individual electrodes. Solder mounting can be performed on the side surface of the actuator, and thus chamfering is often performed to provide an angled or inclined portion the side surface. For the FPC, a base material made of polyimide or the like and an insulating cover layer made of a material having the same thickness and material type as the base are joined together with an adhesive. If the plating used for the wiring is thick, the plating may warp due to stress or the like. Additionally, when plating is thickened, it is more likely that adjacent wires or electrode formed at a fine pitch will be inadvertently connected to other adjacent electrodes or wiring, and thus, the thickness of the plating for this purpose is generally about 10 µm or less. When the insulating cover layer is thick, the number of available mounting portions is reduced, or alternatively the FPC needs to be lengthened in order to provide sufficient mounting portions.

DETAILED DESCRIPTION

In general, according to one embodiment, a liquid discharge head includes a flexible printed circuit (FPC) extending in a first direction and having a first end portion at a first end in the first direction. The FPC has a wiring layer with a first region in the first end portion and a second region beyond the first region in the first direction. An insulating cover layer of the FPC covers the second region. A plurality of piezoelectric elements are provided spaced from each other in a second direction. Each piezoelectric element has a first electrode on a first side surface facing in a third direction perpendicular to the second direction. The first side surface has thereon a joint surface facing the first region of the wiring layer in the third direction. The first electrode is electrically connected to the wiring layer via the joint surface. The first side surface also including a step portion below the joint surface in the first direction. The step portion is recessed from the joint surface in the third direction. A portion of the insulating cover layer protrudes in the third direction into a space adjacent to the step portion in the third direction.

Figure 1:
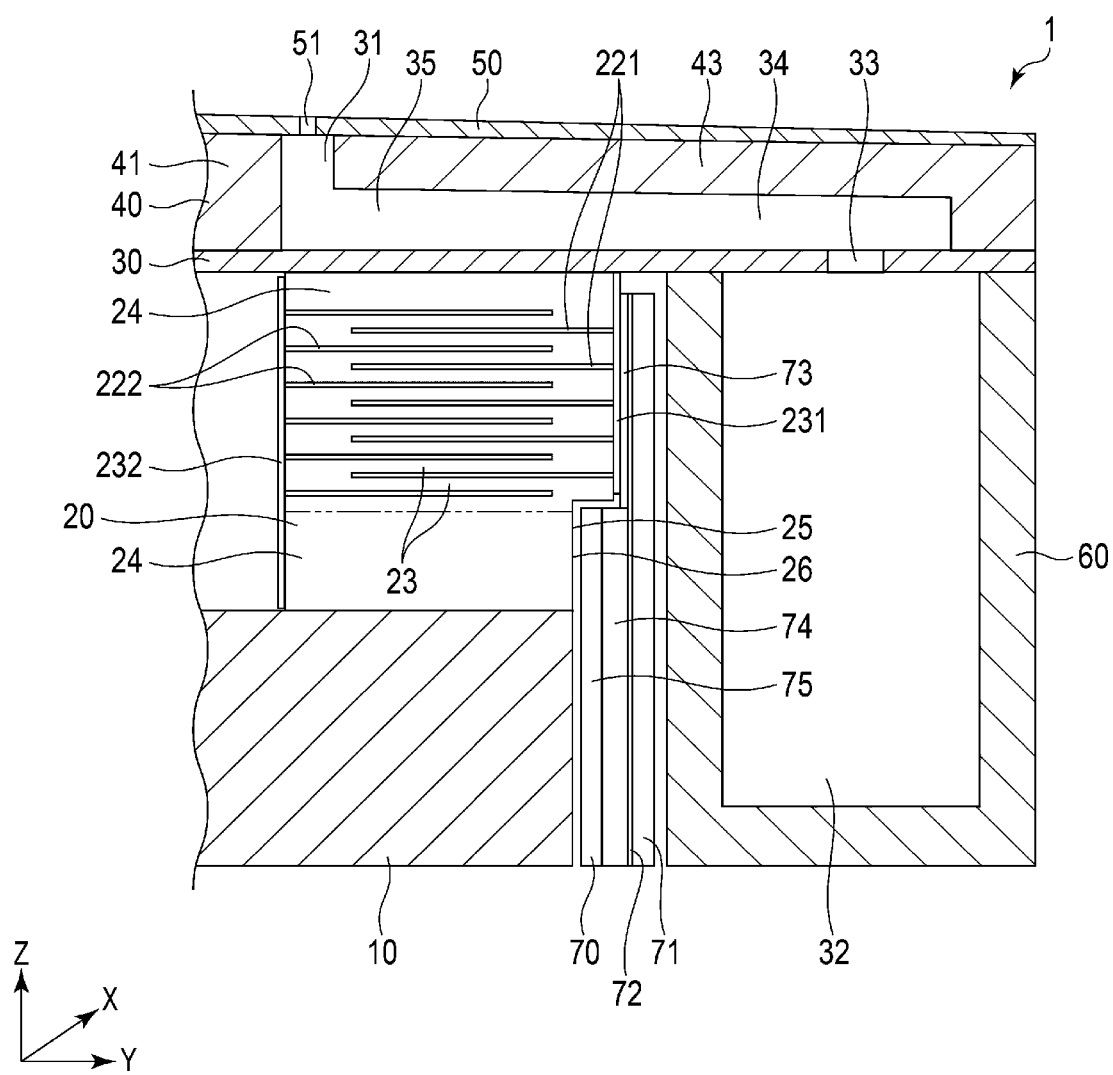
FIG. 1 is a cross-sectional view of an inkjet head according to a first embodiment.
Figure 2:
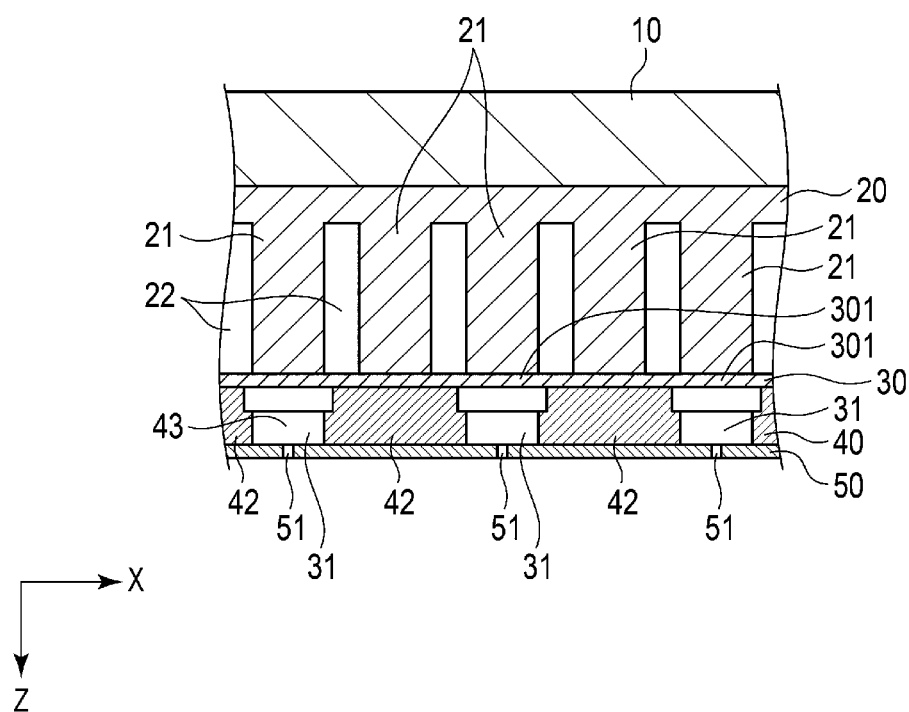
FIG. 2 is a cross-sectional view showing a configuration of an inkjet head according to a first embodiment.
Figure 3:
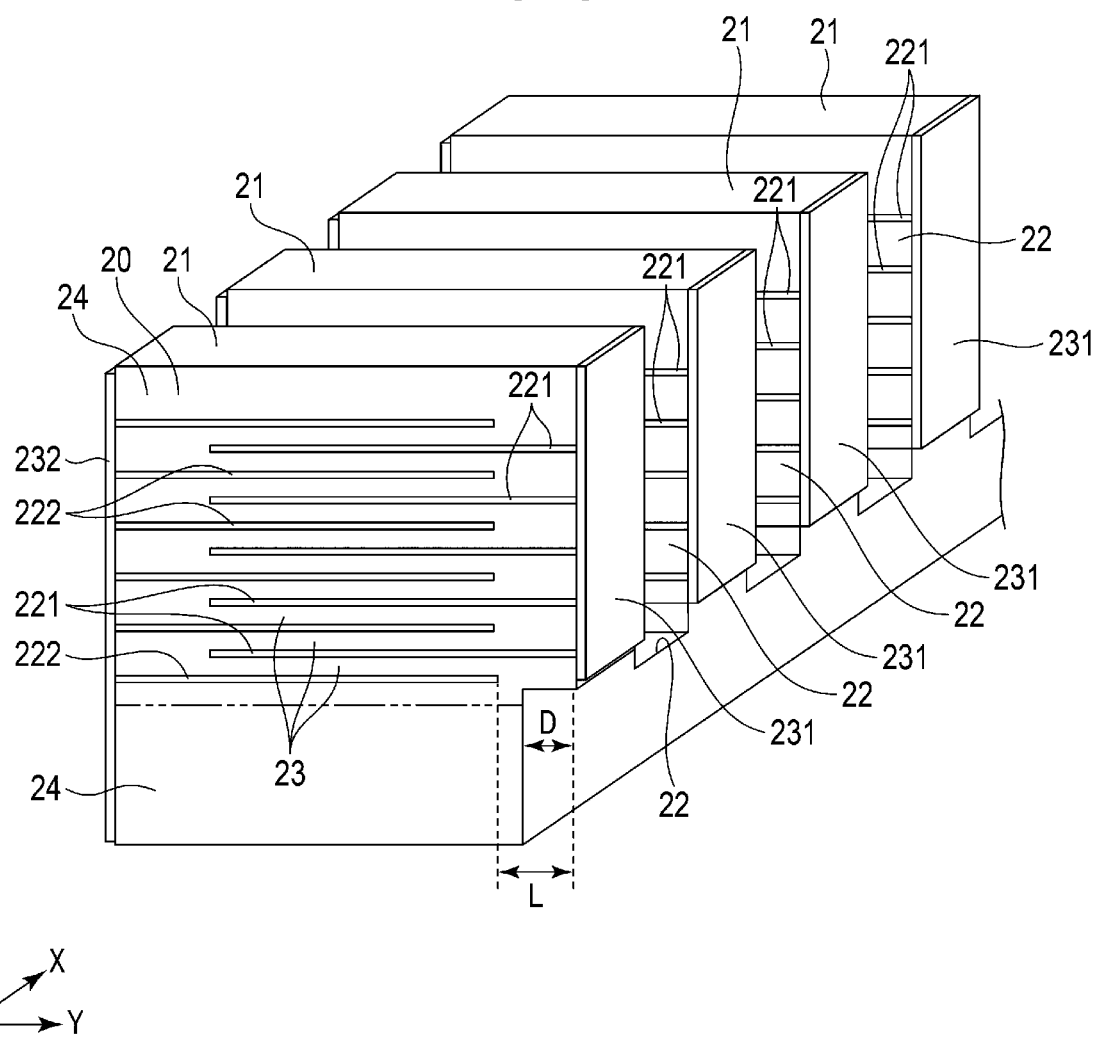
FIG. 3 is a perspective view of a piezoelectric member.
Figure 4:
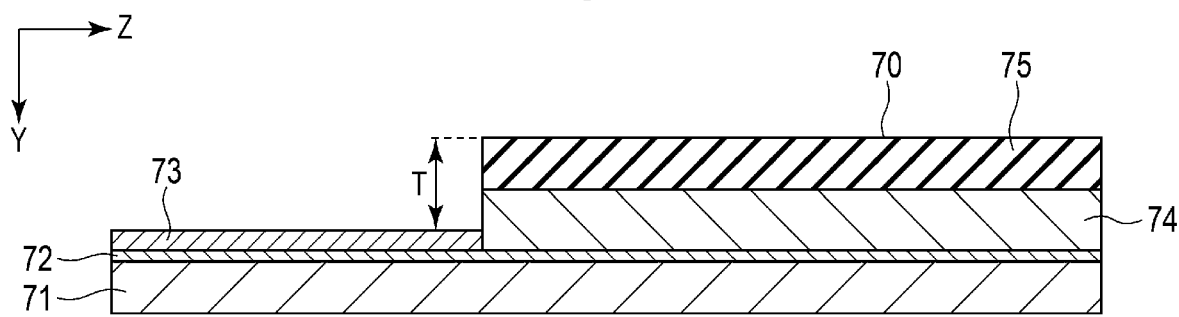
FIG. 4 is a cross-sectional view of a flexible printed circuit (FPC) board.
Figure 5:
FIG. 5 depicts aspects of a manufacturing method related to an inkjet head according to a first embodiment.
Figure 5:
Figure 5:
Figure 5:
Figure 5:
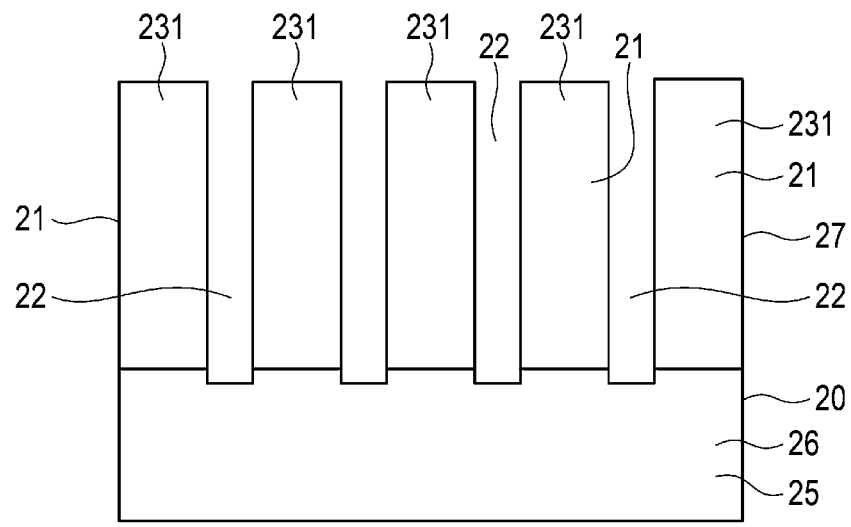
Figure 6:
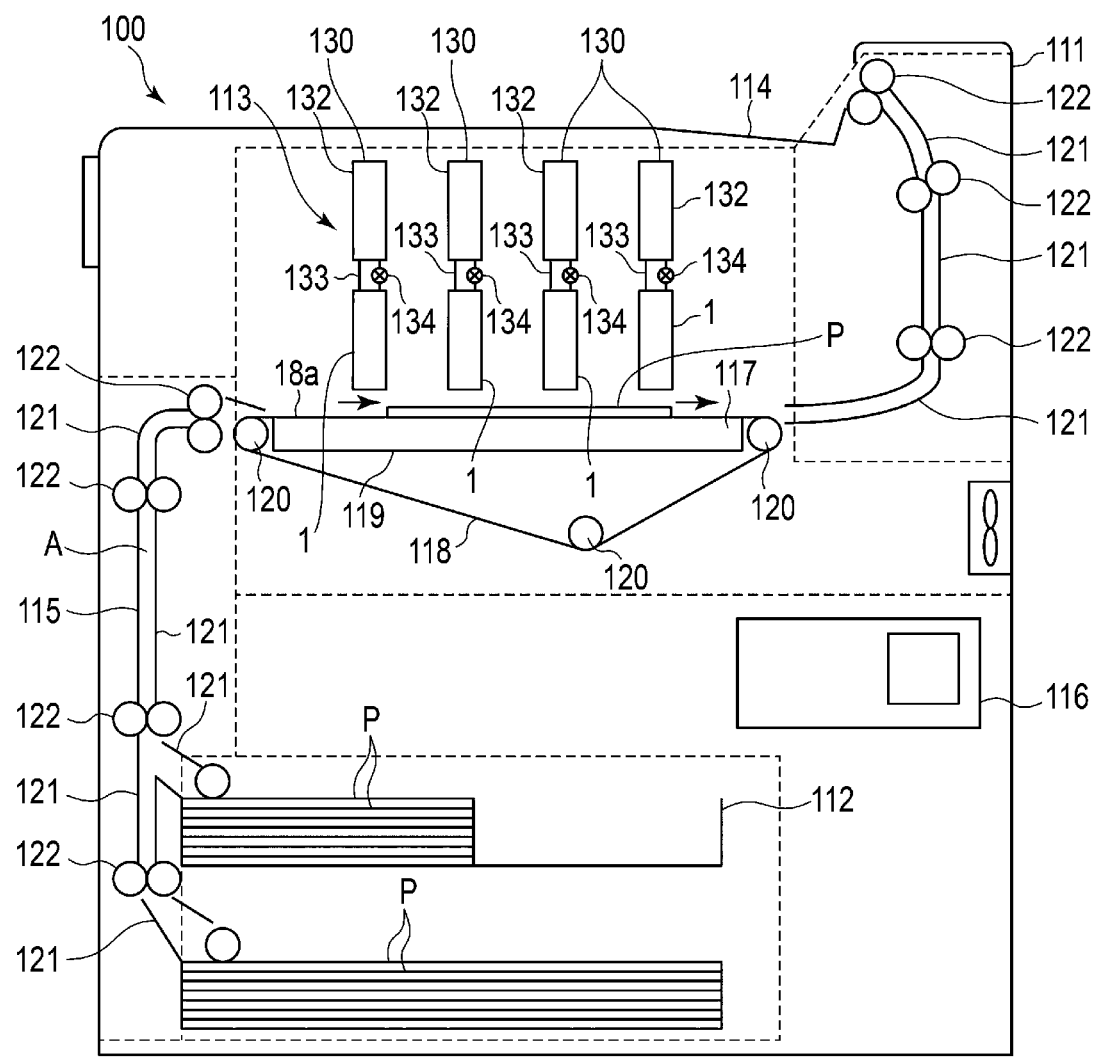
FIG. 6 depicts a schematic configuration of an inkjet recording device according to a first embodiment.

Hereinafter, certain example embodiments will be described with reference to the drawings. In general, the drawings are schematic and provided for purposes of description of various aspects of the present disclosure. In the individual drawings, various components, details, aspects, or the like may be omitted, altered, modified, enlarged, reduced to permit description of particular aspects of the present disclosure. In one embodiment, an inkjet head 1, which is one type of a liquid discharge head, and an inkjet recording device 100, which is one type of a liquid discharge device, will be described with reference to FIGS. 1 to 6. FIGS. 1 and 2 are cross-sectional views showing a schematic configuration of inkjet head 1. FIG. 3 is a perspective view showing a configuration of a piezoelectric member. FIG. 4 is an explanatory view showing a configuration of an FPC. FIG. 5 is an explanatory view showing aspects of a manufacturing method of an inkjet head 1. FIG. 6 shows a schematic configuration of an inkjet recording device 100.

The inkjet head 1 includes a base 10, a piezoelectric member 20, a diaphragm 30, a manifold 40, a nozzle plate 50 (having a plurality of nozzles 51), a frame 60, and an FPC 70.

The piezoelectric member 20 includes a single or a plurality of piezoelectric elements 21. As an example, one side of the piezoelectric member 20 is divided by a plurality of grooves 22, and the plurality of piezoelectric elements 21 and the plurality of grooves 22 are alternately arranged in parallel along a direction indicated by X in the drawing.

The piezoelectric element 21 is an actuator and includes a plurality of piezoelectric layers 23 stacked in a direction indicated by the Z direction in the drawing, a dummy layer 24, internal electrodes 221 and 222 formed on the main surface of each piezoelectric layer 23, and external electrodes 231 and 232. The piezoelectric element 21 is arranged, for example, at one end of the base 10 in the Z direction and is joined to the base 10.

The piezoelectric layer 23 is made of a piezoelectric material such as PZT (lead zirconate titanate) or lead-free KNN (potassium sodium niobate). The piezoelectric layer 23 is formed in a thin plate shape. The plurality of piezoelectric layers 23 are stacked in the thickness direction along the Z direction and are joined to each other via an adhesive layer.

The internal electrodes 221 and 222 are conductive films having a predetermined shape. The internal electrodes 221 and 222 are made of a conductive material such as silver-palladium that can be heated or brazed. The internal electrodes 221 and 222 are formed in a region on the main surface of each piezoelectric layer 23. The internal electrodes 221 and 222 are different from each other. For example, each internal electrode 221 is formed in a region that reaches an end of the piezoelectric layer 23 but does not reach the other end in a direction indicated by the Y direction in the drawing. Each internal electrode 222 is formed in a region that does not reach one end of the piezoelectric layer 23 but does reach the other end in the Y direction. The internal electrodes 221 and 222 are respectively connected to external electrodes 231 and 232 formed on the side surfaces of the piezoelectric element 21.

The external electrodes 231 and 232 are formed on the side surface of the piezoelectric element 21, and are formed by collecting the ends of the internal electrodes 221 and 222. For example, the external electrodes 231 and 232 are formed on opposite end surfaces from each other. The external electrodes 231 and 232 can be formed by any known method, such as a plating method or a sputtering method, using nickel (Ni), chromium (Cr), gold (Au), or the like. In some examples, it may be desirable that gold be used to promote solder joining between different electrode types. In the present example, external electrode 231 and the external electrode 232 are arranged on different surfaces. Alternatively, the external electrodes 231 and 232 may be routed to different regions on the same side surface.

In the present embodiment, as an example, the external electrode 231 is assumed to be an individual electrode (an individually addressable and/or controllable electrode permitting different actuators to be controlled separately) and the external electrode 232 is assumed to be a common electrode (an electrode which is not differentially controlled for controlling different actuators or the like). As shown in FIGS. 3 and 5, external electrodes 231 are provided for each of the plurality of piezoelectric elements 21. The external electrodes 231 can be formed by dividing a single electrode layer divided with grooves. The external electrodes 231 are electrically separated from each other and can thus be separately addressed. The external electrodes 232 can be formed from a single electrode layer in a similar fashion to the external electrodes 231, however, in this example, since the external electrodes 232 are operated as a common electrode (each is external electrode 232 is electrically connected to each other external electrode 232) the external electrode 232 can remain connected to each other in a region close to the base of the groove. The external electrodes 232 may be grounded (ground potential electrodes), for example.

The external electrodes 231 are connected to the FPC 70 and is connected to a mounting component such as a drive IC via various wirings.

The dummy layer 24 is made of the same material as the piezoelectric layer 23. The dummy layer 24 has an electrode on only one side and thus is not deformed because an electric field is not applied across the dummy layer 24. That is, the dummy layer 24 does not function as a piezoelectric body, but rather serves as a base for fixing other elements/components, and/or providing a polishing allowance (tolerance) permitting polishing for obtaining dimensional accuracy in manufacturing.

A step portion 25 is formed at the end of the piezoelectric element 21 on the individual electrode side. The end surface of the piezoelectric element 21 on the side where the individual electrodes are arranged has a recessed surface 26 formed on the base 10 side so as to be retracted in the direction away from the FPC 70, and has a joint surface 27 formed on a pressure chamber 31 side opposite to the base 10 side to protrude toward the FPC 70. The recessed surface 26 and the joint surface 27 are arranged on one side and the other side of the step portion 25 in the Z direction, respectively, and extend in the plane direction along the Z direction (stacking direction) and the X direction (arrangement direction of the pressure chambers). The depth D of the step portion 25 (see FIG. 3) is less than the length (L) (see FIG. 3) of the portion of the piezoelectric element 21 in which the internal electrodes 221 and 222 are not stacked in the Z direction, but is deeper than the difference in position between an electrode layer 72 and an insulating cover layer 75, that is, the thickness difference (T) (see FIG. 4) between the surface of the insulating cover layer 75 and the mounting portion. For example, the step portion 25 is provided on the dummy layer 24. That is, a portion of the piezoelectric element 21 that does not function as a piezoelectric body and is not deformed is configured to be partially cut off. In some examples, step portion 25 may be formed by removal of a part of the piezoelectric layer 23, and in this case, the step portion 25 is formed at a position avoiding removal of the internal electrodes 221 and 222 and the external electrodes 231 and 232. A part of the insulating cover layer 75 is disposed in the space left between the base layer 71 and the piezoelectric element 21 by the presence of the step portion 25.

As an example, in each piezoelectric element 21, the number of stacked piezoelectric layers 23 is 50 or less, the thickness of each layer is 10 μm to 40 μm. The product of the thickness and the total number of stacked layers is selected to be less than 1000 μm.

The piezoelectric element 21 vibrates vertically (up and down) along the stacking direction of the piezoelectric layer 23 when a voltage is applied to the internal electrodes 221 and 222 via the external electrodes 231 and 232. In this context, vertical vibration referred to here is a "vibration in the thickness direction as defined by the piezoelectric constant d33".

In the present embodiment, as shown in FIG. 2, one-half of the piezoelectric elements 21 are arranged above the pressure chambers 31 across the diaphragm 30, and the other half of the piezoelectric elements 21 are arranged at positions facing a partition wall portion 42 across the diaphragm 30.

The diaphragm 30 extends in a plane direction orthogonal to the Z direction, for example. The diaphragm 30 is disposed on one side of the piezoelectric element 21, that is, on the surface on the nozzle plate 50 side. In the depicted example, diaphragm 30 has a plurality of vibrating portions 301 facing respective pressure chambers 31 and these can be individually displaced, but the plurality of vibrating portions 301 are integrally formed as part of a single diaphragm 30. In other examples, a plurality of diaphragms 30 that are individually displaceable may be arranged in positions corresponding to the vibrating portions 301.

The diaphragm 30 is joined to one end surface of the piezoelectric element 21. As an example, in the present embodiment, the regions at both ends of the Y direction are joined to the manifold 40 on one main surface of the diaphragm 30. At the central portion of the inkjet head 1 along the Y direction, the pressure chamber 31 and a guide flow path 34 for containing ink are formed between the diaphragm 30 and the manifold 40 in Z direction. On the other surface of the diaphragm 30, a region on one end side is joined to the piezoelectric element 21, and a predetermined region on the opposite end side is joined to the frame 60. A common chamber 32 for containing ink is formed between the diaphragm 30 and the frame 60 in the Z direction. That is, one side of the diaphragm 30 faces the piezoelectric element 21, and the other side faces the pressure chamber 31, the partition wall portion 42, and the guide flow path 34.

Each pressure chamber 31 connects to a nozzle 51 (the pressure chamber 31 is in fluid communication with a corresponding nozzle 51) formed in the nozzle plate 50. The plurality of pressure chambers 31 and the guide flow paths 34 are separated from each other in the X direction by a partition wall portion 42 provided in the manifold 40.

The diaphragm 30 includes an opening 33 (FIG. 1) that connects a pressure chamber 31 and the common chamber 32. The pressure chamber 31 is formed on one side of the diaphragm 30, and the common chamber 32 is formed on the other side of the diaphragm 30. The common chamber 32 extends in the X direction and connects to a plurality of pressure chambers 31 (each via a respective opening 33) arranged in the X direction. The diaphragm 30 is deformed by the deformation of a piezoelectric element 21 and thus changes the volume of a pressure chamber 31.

The manifold 40 is joined to one side of the diaphragm 30. The manifold 40 is disposed between the nozzle plate 50 and the diaphragm 30, and has ink flow paths 35 separated by partition wall portions 42. Guide flow paths 34 extend in the Y direction from the pressure chambers 31 (ink flow paths 35) toward an opening 33. The manifold 40 includes a frame-shaped portion 41 joined to an outer edge portion of the diaphragm 30. The manifold 40 includes a plurality of partition wall portions 42 that separate the individual ink flow paths 35. The manifold 40 has a guide wall 43 that forms each guide flow path 34. One side of each pressure chambers 31 is closed by the nozzle plate 50, and the other side is closed by the diaphragm 30 and connects to the common chamber 32 via a guide flow path 34 and opening 33. The pressure chamber 31 holds therein liquid supplied from the common chamber 32 via the guide flow path 34, and is deformed by the vibration of the diaphragm 30 to discharge liquid from the nozzle 51.

The nozzle plate 50 is formed in a square plate shape and has a thickness of about 10 μm to 100 μm. The nozzle plate 50 may be made of a metal such as stainless steel (SUS) and nickel (Ni) or a resin material such as polyimide. The nozzle plate 50 is disposed on one side of the manifold 40 so as to cover the opening on one side of the pressure chamber 31. A plurality of nozzles 51 are formed in the nozzle plate 50. The nozzles 51 are arranged to form a nozzle row. Each nozzle 51 is provided at a position corresponding to one of the pressure chambers 31.

The frame 60 is disposed on the other side of the diaphragm 30. The frame 60 forms the common chamber 32 in conjunction with the diaphragm 30. The common chamber 32 is formed inside the frame 60 and connects to the pressure chambers 31 via the opening 33 and the guide flow path 34.

The FPC 70 is connected to the various individual electrodes. The FPC 70 includes a base layer 71, an electrode layer 72, a solder plating layer 73, an adhesive layer 74, and an insulating cover layer 75.

The base layer 71 is typically made of polyimide and is formed in a sheet shape of a predetermined thickness. The electrode layer 72 (also referred to as a wiring layer) is made of a conductive material such as metal and formed on the surface of the base layer 71 in a predetermined pattern (wiring pattern). The solder plating layer 73 is formed on the surface of the electrode layer 72 in a first region. This first region is also referred to as a joint region. The first region is the region of FPC 70 that is ultimately joined to a piezoelectric element 21. The solder plating layer 73 comprises plated solder and has a thickness of about 3 to 10 μm. The insulating cover layer 75 is formed on the surface of the electrode layer 72 in a second region outside than the joint region. The insulating cover layer 75 is attached to the second region of the FPC 70 via the adhesive layer 74. In this context, one end portion (a first end portion) of the FPC 70 in the Z direction is referred to as a first region, and the opposite end portion (a second end portion) is referred to as a second region.

The first region (on which the solder plating layer 73 has been formed) is aligned so as to face the corresponding joint surface 27 of the piezoelectric element 21 and then heated. When heated, solder of the solder plating layer 73 is melted, whereby the FPC 70 is electrically and mechanically connected to the external electrode(s) 231. The heating may be performed using any heating tool or device, for example, heating may be by irradiation with an infrared laser or the like transmitted through the base layer 71 of the FPC 70.

Due to the difference between the total thickness of the insulating cover layer 75 and the adhesive layer 74 and the thickness of the solder plating layer 73, the thickness of the second region becomes greater than the thickness of the first region, and a step is formed on the surface of the FPC 70. For example, the dimension T in the thickness direction of the step is 50 μm to 100 μm.

At least a part of the second region of the FPC 70 in which the insulating cover layer 75 and the adhesive layer 74 are formed, is disposed to face the recessed surface 26. Specifically, a portion where the insulating cover layer 75 and the adhesive layer 74 are stacked is disposed to be in the space formed by the step of the recessed surface 26. The solder plating layer 73 is disposed to face the joint surface 27, and the insulating cover layer 75 is disposed to face the recessed surface 26.

In the inkjet head 1, the ink flow paths 35, the guide flow paths 34, and the common chamber 32 are formed by the nozzle plate 50, the frame 60, the manifold 40, and the diaphragm 30 in conjunction with each other. In some examples, the common chamber 32 connects to a cartridge (supply tank or the like), and ink is supplied to each pressure chamber 31 through the common chamber 32. If a drive voltage is applied across the corresponding electrodes 221 and 222 by the drive IC in the inkjet head 1, the piezoelectric element 21 vibrates in the stacking direction, that is, in the thickness direction of each piezoelectric layer 23. That is, the piezoelectric element 21 vibrates vertically. The diaphragm 30 (vibrating portion 301) vibrates due to the vertical vibration of the piezoelectric element 21, and the corresponding pressure chamber 31 is deformed by vibrations in the Z direction. As the internal volume of the pressure chamber 31 changes, ink is drawn from the common chamber 32, and then subsequently discharged from the nozzle 51.

In the manufacturing the inkjet head 1 according to the present embodiment, the piezoelectric layer 23 (on which the internal electrodes 221 and 222 are printed) is piezoelectric material formed in the sheet shape. The internal electrodes 221 and 222 are printed on a piezoelectric layer 23, then a plurality of piezoelectric layers 23 (having internal electrodes 221 and 222 printed thereon) are stacked and heated to form a stacked piezoelectric body 201.

As shown in FIG. 5, external electrodes 231 and 232 are formed on end surfaces of the stacked piezoelectric body 201 by a printing processing. Then, by a dicing processing, the step portion 25 is formed at the end on which the external electrode 231 is disposed. By forming the step portion 25, a portion of the external electrode 231 on the base 10 side is removed. Further, by forming a plurality of grooves 22 having a depth reaching to where the electrode has been removed by the step portion 25, one side of the stacked piezoelectric body 201 is divided into a plurality of portions to form a plurality of piezoelectric elements 21. As described above, the piezoelectric member 20 with one side divided into a plurality of portions and the other end side is still connected is formed. Here, by setting the groove 22 to a depth reaching the portion where an initially formed electrode layer is separated into separate pieces independent individual electrodes electrically separated from each other are formed. On the other hand, the portions of an electrode layer initially formed on the on the side surface without the step remains connected to each other such that an electrically continuous common electrode can be formed by connections (remain electrode layer portions) in the region below the bottom of the groove. Further, the piezoelectric element 21 is attached to the base 10 with an adhesive or the like. Then, the FPC 70 (more particularly the electrode layer 72 thereof) is connected to the external electrodes 231 to permit an individual control of these electrodes. Subsequently, the manifold 40 and the frame 60 are joined, the nozzles 51 are arranged to face respective pressure chambers 31, and the nozzle plate 50 is adhered to complete the inkjet head 1.

Hereinafter, an example of the inkjet recording device 100 including the inkjet head 1 will be described with reference to FIG. 6. The inkjet recording device 100 includes a housing 111, a medium (paper) supply unit 112, an image forming unit 113, a medium (paper) discharge unit 114, a conveyance device 115, and a control unit 116.

The inkjet recording device 100 is a liquid discharge device that performs an image forming process on a sheet P by ejecting ink while the sheet P is being conveyed along a predetermined conveyance path A from the medium supply unit 112 to the medium discharge unit 114 through the image forming unit 113.

The housing 111 forms the outer shell of the inkjet recording device 100. A discharge port for discharging the sheet P to the outside is provided at a predetermined location of the housing 111.

The medium supply unit 112 can comprise a plurality of sheet feed cassettes for a plurality of sheets P of various sizes.

The medium discharge unit 114 includes a sheet discharge tray configured to be able to hold the sheet P discharged from the discharge port.

The image forming unit 113 includes a support unit 117 that supports the sheet P, and a plurality of head units 130 that are arranged to face each other above the support unit 117.

The support unit 117 includes a conveyance belt 118 provided in a loop shape, a support plate 119 that supports the conveyance belt 118 from the back side, and a plurality of belt rollers 120 provided on the back side of the conveyance belt 118.

At the time of image formation, the support unit 117 supports the sheet P on the conveyance belt 118, and feeds the conveyance belt 118 at a predetermined timing by the rotation of the belt roller 120 to convey the sheet P to the downstream side.

The head unit 130 includes a plurality of inkjet heads 1, an ink tank 132 for each respective inkjet head 1, a connection flow path 133 connecting the inkjet head 1 to the respective ink tank 132, and a supply pump 134.

In the present embodiment, inkjet heads 1 for four colors (cyan, magenta, yellow, and black), and ink tanks 132 containing respective inks of these colors are provided.

A negative pressure control device such as a pump can be connected to the ink tank 132. The ink supplied to each nozzle 51 of the inkjet head 1 can be maintained in a meniscus of a predetermined shape by controlling the pressure inside of the ink tank 132 with a negative pressure by the negative pressure control device according to the hydrostatic head value of liquid between the inkjet head 1 and the ink tank 132.

The supply pump 134 is, for example, a liquid feed pump composed of a piezoelectric pump. The supply pump 134 is provided in the supply flow path. The supply pump 134 is connected to the drive circuit of the control unit 116 by wiring and is configured to be controllable by control by a Central Processing Unit (CPU) or the like. The supply pump 134 supplies the liquid to the inkjet head 1.

The conveyance device 115 conveys the sheet P along the conveyance path A from the medium supply unit 112 to the medium discharge unit 114 through the image forming unit 113. The conveyance device 115 includes a plurality of guide plate pairs 121 arranged along the conveyance path A, and a plurality of conveyance rollers 122.

Each of the plurality of guide plate pairs 121 includes a pair of plate members arranged so as to face each other, and guides the sheet P along the conveyance path A between the pair of plate members.

The conveyance roller 122 is driven by the control of the control unit 116 and rotates to feed the sheet P to the downstream side along the conveyance path A. Sensors for detecting the sheet conveyance status can be arranged at various places on the conveyance path A.

The control unit 116 comprises a control circuit such as a CPU that functions a controller, a Read Only Memory (ROM) that stores various programs, and a Random Access Memory (RAM) that temporarily stores various variable data and image data, and an interface unit for receiving data from the outside and outputting data to the outside.

In the inkjet recording device 100, upon receiving a print instruction by the operation of a user on the operation input unit or otherwise, the control unit 116 drives the conveyance device 115 to convey the sheet P and also outputs a print signal to the head unit 130 at a predetermined timing to drive the inkjet head 1. As an ejection operation, the inkjet head 1 sends a drive signal to the drive IC as an image signal corresponding to the image data. The control unit 116 (via operation of the drive IC) applies a drive voltage to the internal electrodes 221 and 222, and selectively drives the piezoelectric elements 21 to vibrate vertically in the stacking direction and changes the volume of a pressure chamber 31, thereby, ejecting ink from the corresponding nozzle 51 and forming an image on the sheet P held on the conveyance belt 118. Further, as part of a liquid discharge operation, the control unit 116 supplies ink from the ink tank 132 to the common chamber 32 of the inkjet head 1 by driving the supply pump 134.

According to the inkjet head 1 and the inkjet recording device 100, a piezoelectric element 21 has the step portion 25 on the surface side facing the FPC 70, and thus, a part of the FPC 70 can be disposed in the region (space) formed by the step portion 25. Therefore, even if the insulating cover layer 75 of the FPC 70 is thick in some parts, the FPC 70 can be mounted without leaving a large dead (unfilled) space. Thus, dead space can be eliminated or significantly reduced, and as a result, the device size can be reduced at a low cost. Furthermore, by forming the stepped shape having the recessed surface 26 along the stacking direction, the accuracy and warpage of the PZT material or the like is less affected and the accuracy in the manufacturing processing related to the electrode removing/separation portion is high as compared with the case of processing such material into a tapered shape or the like. Since the piezoelectric element 21 is a stacked piezoelectric actuator, the driving is not directly affected even if a step is provided. Therefore, the functioning of the piezoelectric element 21 does not deteriorate.

The present disclosure is not limited to the above examples.

Figure 7:
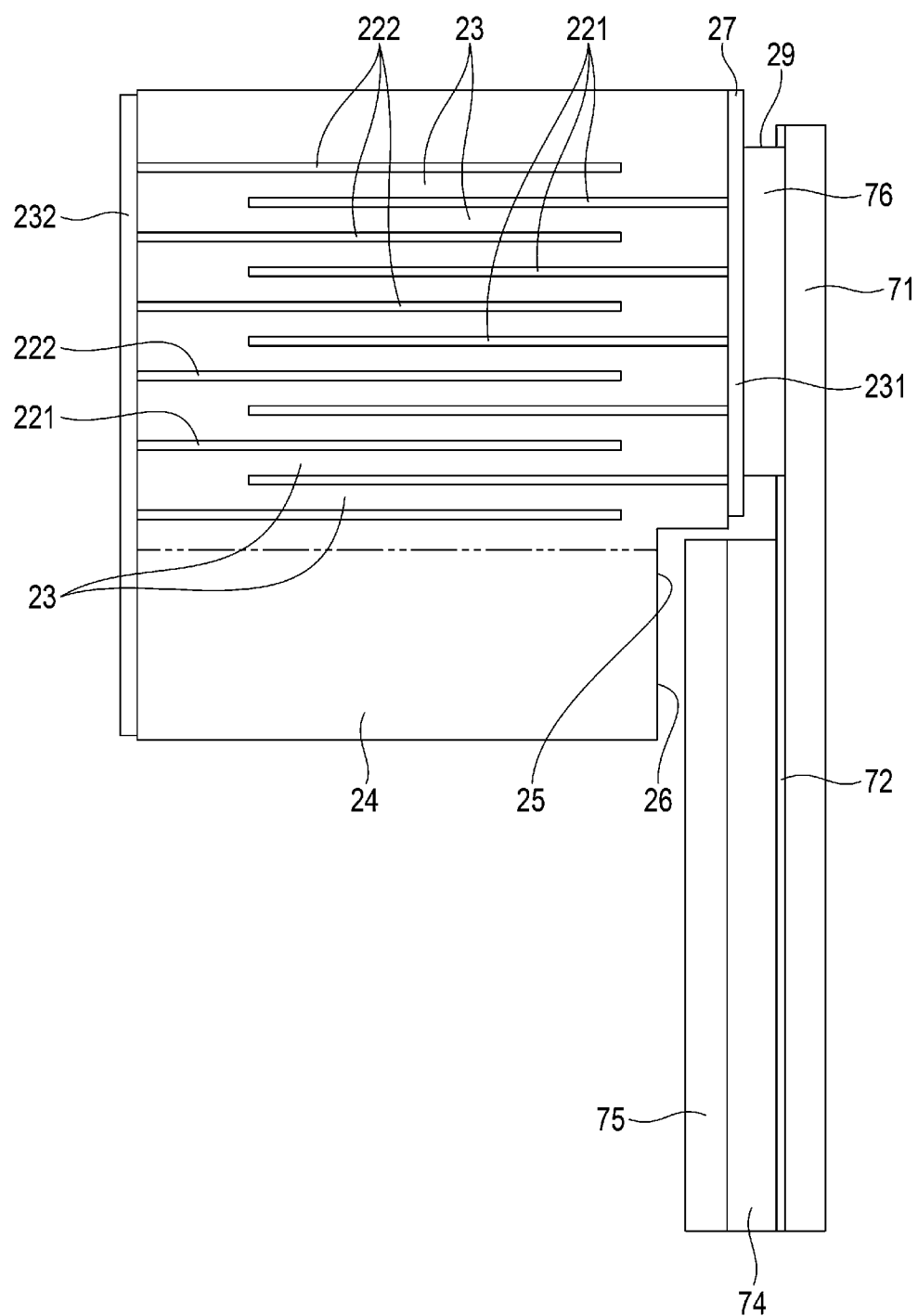
FIG. 7 is a cross-sectional view of an inkjet head according to a second embodiment.

For example, in the above embodiment, the external electrode 231 and the electrode layer 72 can be solder-joined, but the present disclosure is not limited thereto. For example, as shown in FIG. 7, the external electrode 231 and the electrode layer 72 may be joined by an anisotropic conductive adhesive 29 such as provided by anisotropic conductive film (ACF) 76. In this second embodiment, the insulating cover layer 75 and the adhesive layer 74 also avoid overlapping the joint surface 27, and thus, more reliable mounting is possible.

Figure 8:
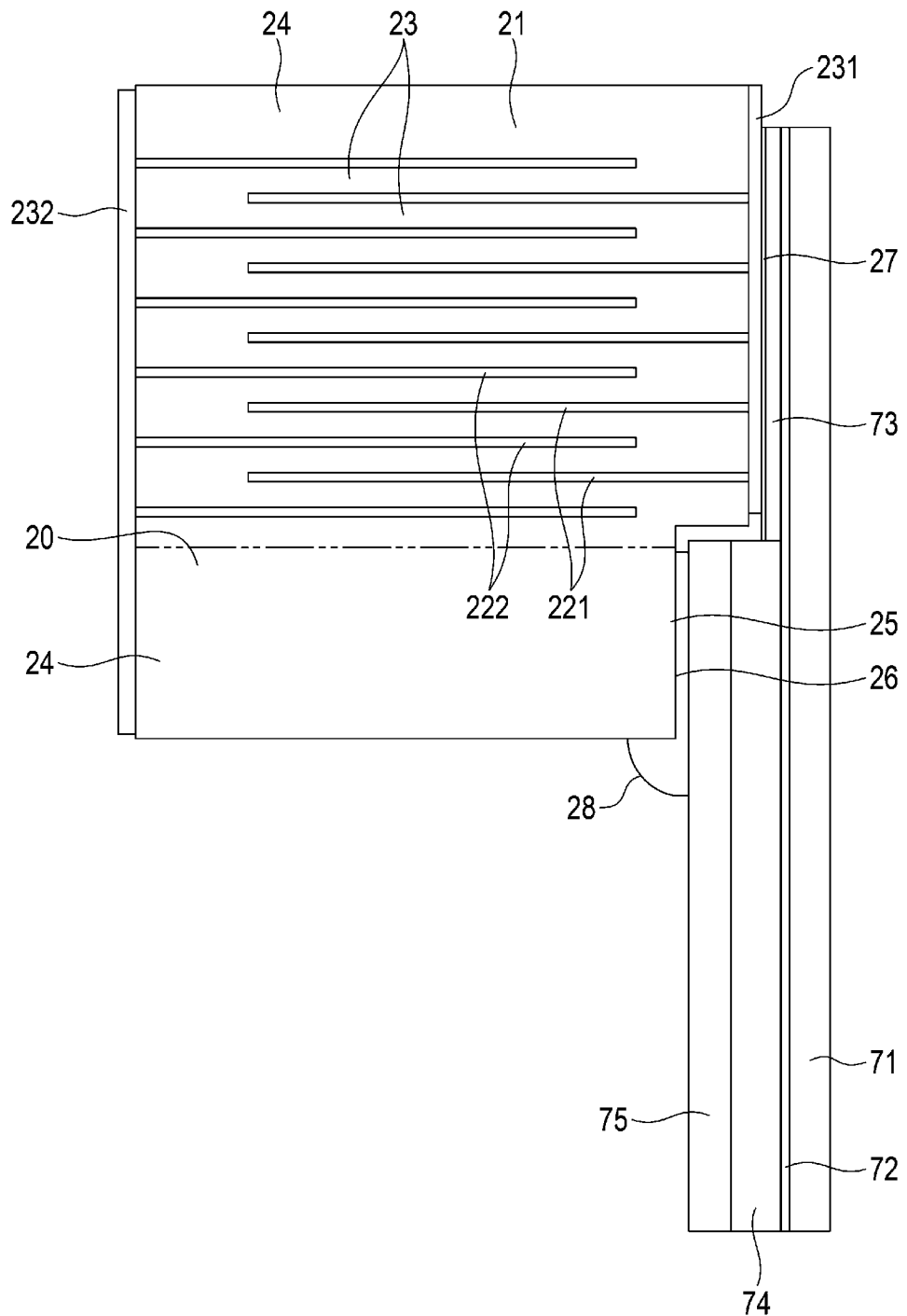
FIG. 8 is a cross-sectional view of an inkjet head according to another embodiment.

Further, as shown in FIG. 8, an adhesive 28, such as a resin material or the like, can be filled into the region between the surface of the insulating cover layer 75 of the FPC 70 and the recessed surface 26, and the surface of the insulating cover layer 75 of the FPC 70 and the recessed surface 26 may be joined to each other by the adhesive 28. Since the FPC 70 is joined at a plurality of locations in the longitudinal direction, the mounting portion can be reinforced and peeling can be reduced. The example of FIG. 8 can also be combined with the example of FIG. 7.

Figure 9:
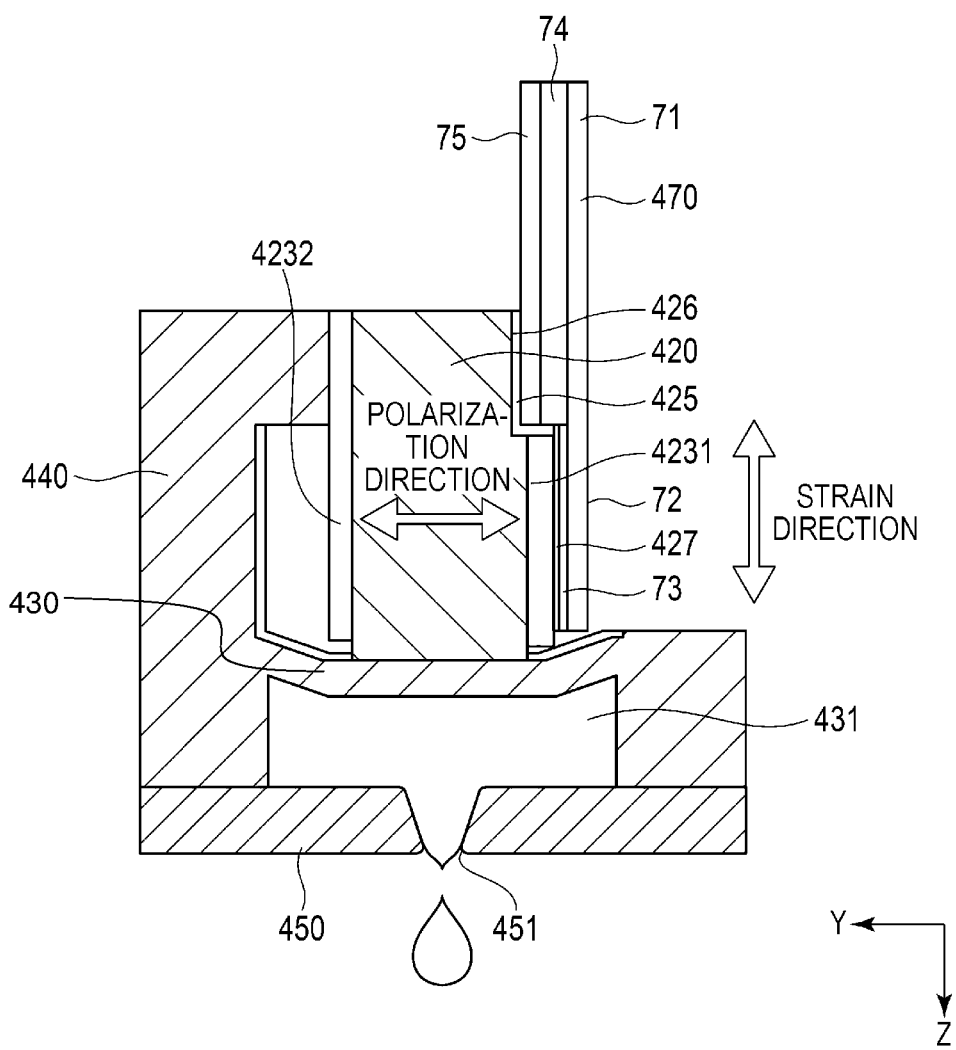
FIG. 9 is a cross-sectional view depicting aspects of an inkjet head according to another embodiment.

Furthermore, although the stacked piezoelectric element 21 is illustrated in the above embodiments, a configuration using a single-layer piezoelectric body may be used in other examples. For example, a liquid discharge head 400 as shown in FIG. 9 includes a piezoelectric member 420, a diaphragm 430, a manifold 440. The manifold 440 in conjunction with a nozzle plate 450 and the diaphragm 430 form a plurality of pressure chambers 431. The nozzle plate 450 has a plurality of nozzles 451. An FPC 470 is affixed to the piezoelectric member 420. In this embodiment, the polarization direction and the strain direction of the piezoelectric member 420 are arranged orthogonally, and the FPC 470 is joined to the side surface portion extending along the strain direction.

That is, the side surface portion of the piezoelectric member 420 on one end side in the polarization direction includes a step 425, and a joint surface 427 joined to the FPC 470 via the step 425, and a recessed surface 426 disposed on the other side of the step 425 and disposed at a position recessed from the FPC 470 with respect to the joint surface 427. An individually addressable external electrode 4231 is formed one side in the polarization direction. The joint surface 427 is disposed on the end portion of the piezoelectric member near the pressure chamber 431, and the recessed surface 426 is disposed on an end portion opposite from the pressure chamber 431 end. A common external electrode 4232 is formed on the side surface of the piezoelectric member 420 opposite from the external electrode(s) 4321 in the polarization direction.

Also in the present embodiment, since the side surface portion of the piezoelectric member 420 includes the step 425 which is on the individual electrode 231 side that is joined to the FPC 470 and the step 425 is recessed with respect to the joint surface 427, dead space can be eliminated and the device size can be reduced. In the case of a single-layer piezoelectric body, an external electrode serves as a driving electrode. However, by forming the step 425 only in a portion where the electrode is not disposed, such as a fixing portion fixed to the manifold 440, the same effect as that of the above embodiments can be obtained.

Furthermore, the specific configurations of the piezoelectric element 21, the shape of the liquid flow paths, the configuration and positional relationships of various parts including the manifold 40, the nozzle plate 50, and the frame 60 are not limited to the above examples, and can be changed as appropriate. Furthermore, the arrangement of the nozzles 51 and the pressure chambers 31 is not limited to the above. For example, the nozzles 51 may be arranged in two or more rows. In some examples, a dummy chamber may be formed between pressure chambers 31. Further, although an example in which the piezoelectric element 21 has dummy layers 24 at both ends in the stacking direction is shown, the present disclosure is not limited thereto, and the piezoelectric element 21 may have a dummy layer 24 only on one side, or piezoelectric elements 21 may be configured not to include the dummy layer 24.

The liquid to be ejected is not limited to ink for printing, and may be, for example, a device for ejecting a liquid containing conductive particles for forming a wiring pattern of a printed wiring board or the like.

The inkjet head 1 has been shown as an example, but the present disclosure is not limited thereto, and inkjet head 1 and the like can be used in, for example, 3D printers, industrial manufacturing machines, and medical device applications, and it is possible to reduce the size, weight and cost of such machines and devices.

In some example embodiments, a liquid discharge head and a liquid discharge device using a lead-free piezoelectric material can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid discharge head, comprising:
a flexible printed circuit extending in a first direction and having a first end portion at a first end in the first direction, a wiring layer with a first region in the first end portion and a second region beyond the first region in the first direction, and an insulating cover layer covering the second region; and
a plurality of piezoelectric elements spaced from each other in a second direction, each piezoelectric element having a first electrode on a first side surface facing in a third direction perpendicular to the second direction, the first side surface having a joint surface facing the first region of the wiring layer in the third direction, the first electrode being electrically connected to the wiring layer via the joint surface, the first side surface also including a step portion below the joint surface in the first direction, the step portion being recessed from the joint surface in the third direction, wherein
a portion of the insulating cover layer protrudes in the third direction into a space adjacent to the step portion in the third direction, the portion of the insulating cover layer being between the wiring layer and the step portion in the third direction.

2. The liquid discharge head according to claim 1, wherein the first region of the wiring layer is mechanically and electrically connected to the joint surface via solder.

3. The liquid discharge head according to claim 1, wherein the first region of the wiring layer is mechanically and electrically connected to the joint surface via an anisotropic conductive adhesive.

4. The liquid discharge head according to claim 1, wherein the flexible printed circuit includes an anisotropic conductive film.

5. The liquid discharge head according to claim 4, further comprising:
a resin material between the insulating cover layer and the step portion in the third direction, wherein
the resin material has a substantially constant thickness over the second region, and
the step portion has a substantially rectangular cross-section when viewed from the second direction.

6. The liquid discharge head according to claim 1, further comprising:
a resin material between the insulating cover layer and the step portion in the third direction, wherein
the resin material and the insulating cover layer are different materials.

7. The liquid discharge head according to claim 1, wherein each piezoelectric element comprises a plurality of piezoelectric layers stacked in the first direction.

8. The liquid discharge head according to claim 7, wherein the piezoelectric layers comprise potassium sodium niobate.

9. The liquid discharge head according to claim 7, wherein the piezoelectric layers comprise lead zirconate titanate.

10. The liquid discharge head according to claim 1, further comprising:
a pressure chamber adjacent to each piezoelectric element in the first direction, and
a nozzle connected to the pressure chamber from which a liquid can be ejected.

11. The liquid discharge head according to claim 1, wherein
each piezoelectric element comprises a plurality of piezoelectric layers stacked in the first direction on at least one dummy layer comprising the same material as the piezoelectric layers, and
the step portion is adjacent to the at least one dummy in the third direction.

12. The liquid discharge head according to claim 11, wherein the step portion is formed by removal of a portion of at least one of the piezoelectric layers of each piezoelectric element.

13. The liquid discharge head according to claim 11, further comprising:
internal electrode layers between each stacked pair of piezoelectric layers in the first direction.

14. The liquid discharge head according to claim 13, wherein one half of the internal electrode layers are electrically connected to a common electrode on a second side surface of the plurality of piezoelectric elements, the second side surface facing away from the flexible printed circuit in the third direction.

15. The liquid discharge head according to claim 13, wherein the step portion is recessed from the joint surface in the third direction by a distance larger than the distance, in the third direction, between the electrode layer of the flexible printed circuit and an uppermost portion of the insulating cover layer of the flexible printed circuit.

16. A liquid discharge device, comprising:
a support surface; and
a liquid discharge head configured to eject liquid towards the support surface, the liquid discharge head including:
a flexible printed circuit extending in a first direction and having a first end portion at a first end in the first direction, a wiring layer with a first region in the first end portion and a second region beyond the first region in the first direction, and an insulating cover layer covering the second region; and
a plurality of piezoelectric elements spaced from each other in a second direction, each piezoelectric element having a first electrode on a first side surface facing in a third direction perpendicular to the second direction, the first side surface having a joint surface facing the first region of the wiring layer in the third direction, the first electrode being electrically connected to the wiring layer via the joint surface, the first side surface also including a step portion below the joint surface in the first direction, the step portion being recessed from the joint surface in the third direction, wherein
a portion of the insulating cover layer protrudes in the third direction into a space adjacent to the step portion in the third direction, the portion of the insulating cover layer being between the wiring layer and the step portion in the third direction.

17. The liquid discharge device according to claim 16, further comprising:
a resin material between the insulating cover layer and the step portion in the third direction, wherein
the resin material has a substantially constant thickness over the second region of the wiring layer.

18. The liquid discharge device according to claim 16, wherein
each piezoelectric element comprises a plurality of piezoelectric layers stacked in the first direction on at least one dummy layer comprising the same material as the piezoelectric layers, and
the step portion is adjacent to the at least one dummy in the third direction.

19. The liquid discharge device according to claim 16, wherein each piezoelectric element comprises a plurality of piezoelectric layers stacked in the first direction.

20. The liquid discharge device according to claim 17, wherein
the insulating cover layer has a substantially constant thickness over the second region, and
the combined thicknesses of the resin material and the insulating cover layer on the second region are greater than a distance along the third direction from the wiring layer in the first region to the first electrode.

* * * * *